United States Patent [19]

Hochberg et al.

[11] Patent Number: 4,992,306

[45] Date of Patent: Feb. 12, 1991

[54] DEPOSITION OF SILICON DIOXIDE AND SILICON OXYNITRIDE FILMS USING AZIDOSILANE SOURCES

[75] Inventors: Arthur K. Hochberg, Solana Beach; David L. O'Meara, Oceanside; David A. Roberts, Carlsbad, all of Calif.

[73] Assignee: Air Products abd Chemicals, Inc., Allentown, Pa.

[21] Appl. No.: 473,503

[22] Filed: Feb. 1, 1990

[51] Int. Cl.$^5$ .......................... B05D 5/12; C23C 16/40
[52] U.S. Cl. ............................. 427/255.3; 427/255.1; 427/255.2; 437/238; 437/241
[58] Field of Search ..................... 552/4; 427/166, 167, 427/168, 255.1, 255.2, 255.3; 437/235, 238, 241

[56] References Cited

U.S. PATENT DOCUMENTS

| | | | |
|---|---|---|---|
| 4,158,717 | 6/1979 | Nelson | 427/35 |
| 4,401,598 | 8/1983 | Karl et al. | 552/4 |
| 4,569,855 | 2/1986 | Matsuda et al. | 427/35 |
| 4,863,755 | 9/1989 | Hess et al. | 427/38 |

*Primary Examiner*—Shrive Beck
*Assistant Examiner*—Margaret Bueker

*Attorney, Agent, or Firm*—James C. Simmons

[57] ABSTRACT

A low temperature chemical vapor deposition process comprising heating a substrate upon which deposition is desired to a temperature of from about 350° C. to about 700° C. in a chemical vapor deposition reactor at a pressure of from about 0.1 torr to atmospheric pressure, introducing into the reactor a silicon-containing feed and an oxygen containing feed, said silicon containing feed consisting essentially of one or more compounds having the general formula

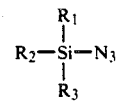

wherein: $R_1$, $R_2$, and $R_3$ are hydrogen, azido or 1-6 carbon alkyl, phenyl or 7 to 10 carbon alkaryl groups, at least one of $R_1$ and $R_2$ being 1-6 carbon alkyl, phenyl or 7-10 carbon alkaryl and maintaining the temperature and pressure in said ranges to cause a film of silicon dioxide or silicon oxynitride to deposit on said substrate is disclosed.

25 Claims, No Drawings

DEPOSITION OF SILICON DIOXIDE AND SILICON OXYNITRIDE FILMS USING AZIDOSILANE SOURCES

FIELD OF THE INVENTION

This invention relates to the manufacture of semiconductor devices and, specifically, to the deposition of silicon dioxide ($SiO_2$), and silicon oxynitride ($Si_xO_yN_z$ wherein x, y and z indicate various compounds being variable ratios of silicon, oxygen and nitrogen) coatings, with particular application in the manufacture of semiconductor devices, but not limited thereto.

BACKGROUND OF THE INVENTION

It is standard practice in the manufacture of many semiconductor devices, and other devices, to provide a thin passive layer or coating of a chemically nonreactive or low reactivity material to protect the semiconductor junctions and layers from degradation by contact with oxygen, fumes in the air, moisture, etc., and from damage by contact during packaging and handling and to stabilize the electrical characteristics of the device.

The production of silicon oxide and silicon nitride coatings application to semiconductor devices and to other devices is well known, and there is considerable literature on the subject. The general principles underlying the formation of thin films are described in HANDBOOK OF THIN FILM TECHNOLOGY, Maissell, Leon I. and Glang, Reinhard, editors, McGraw Hill Book Company, New York, 1970, and the general technology for processing silicon-based semiconductor devices in described in SILICON PROCESSING FOR THE VLSI ERA, Wolf, Stanley, and Talbert, Richard N., editors, Lattice Press, Sunset Beach, Calif., 1986, which includes a discussion of thin film technology.

Silicon dioxide and silicon oxynitride are commonly used as a film-forming material to protect semiconductor devices.

Thus, the present invention relates to the manufacture of devices in which thin films of $SiO_2$ and/or $Si_xO_yN_z$ are deposited on substrates. Economically, the greatest industrial application of this invention is in the manufacture of semiconductor devices; however, the discoveries of this invention are applicable to any thin film deposition of $SiO_2$ and $Si_xO_yN_z$ on substrates which are capable of being heated to temperatures in the range of from about 350° C. to about 700° C.

The chemistry of silanes is described by Arkles, B., Peterson, W. R., Jr., KIRK-OTHMER ENCYCLOPEDIA OF CHEMICAL TECHNOLOGY. 3rd ed. Vol 20. 887-911. Silanes, also referred to as silicon hydrides, are compounds containing a hydrogen-silicon bond. Compounds which include only silicon-carbon bonds, i.e. where all hydrogens have been replaced by alkyl, aryl or aralkyl substituents are also referred to occasionally, and herein, as silanes.

The properties of organosilanes are determined largely by the properties of the silicon atom which is larger than the carbon atom, enabling nucleophilic attack on the silicon to occur more readily than on carbon. Electrophilic attack on hydrogen bonded to silicon is also facilitated by the small steric constraints of hydrogen and the increased bond length for Si—H. In addition to the increased bond length, the Si—H bond energy is considerably lower than C—H and is reflected in the thermal stabilities of such bonds. Organohydrosilanes begin to decompose at 440°-460° C. through homolytic cleavage of the Si—H bond and subsequent radical formation.

Organohydrosilanes undergo a wide variety of chemical conversions. The Si—H bond of organohydrosilanes reacts with elements of most groups of the periodic system. Organosilanes, the simplest of which is methylsilane, are stable to air. The larger-chain alkylsilanes are more stable but ignite spontaneously when vaporized in oxygen under pressure. Phenyl and cyclohexylsilane can be distilled open to the atmosphere. Trialkyl- and triarylsilanes are more stable and have been distilled at as much as 325° C. without decomposition.

Alkylation and arylation of organosilanes occur readily with alkyl and aryl alkalimetal compounds with good yields, especially in tetrahydrofuran and ethyl ether according to the general reaction:

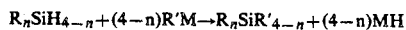

$$R_nSiH_{4-n} + (4-n)R'M \rightarrow R_nSiR'_{4-n} + (4-n)MH$$

where R and R' are alkyl, aryl or aralkyl and M is Li, Na, or K and n=1 to 4.

The preparation of organosilanes by the direct process was first reported in 1945. By this method, $CH_3SiH(Cl)_2$, $(CH_3)_2SiH(Cl)_2$, and $C_2H_5SiH(Cl)_2$ are prepared and utilized as polymers and reactive intermediates. The synthesis involves the reaction of alkyl halides, e.g., methyl and ethyl chloride, with silicon metal or silicon alloys in a fluidized bed at 250°-600° C. Dialkylamino-substituted silanes have also been obtained by a similar process and similar products are formed by cleavage of disilanes by dialkylamines, e.g. diethylamine cleavage yielding $[(C_2H_5)_2N]_2SiH(Cl)$. Organosilanes can be synthesized most conveniently in pilot, bench, and lab scale by reduction of organic-substituted halo- and alkoxysilanes with metal hydrides. The versatility of lithium aluminum hydride permits synthesis of alkyl, alkenyl, and arylsilanes. Silanes containing functional groups, such as chloro, amino, and alkoxyl in the organic substituents, can also be prepared. Organosilanes are also produced by reaction of organohalosilanes and organoalkoxysilanes with organometallic compounds. Organolithium reagents, e.g., t-butyllithium, have also produced organohydrosilanes on reaction with organochlorosilanes and tetrahalosilanes. Disproportionation reactions have also been used to prepare organosilanes. These reactions involve interaction of organosilanes with other silicon compounds containing organic, alkoxy, and halogen groups bound to silicon. Reactions are catalyzed by a variety of materials including alkali metals, alkali metal alcoholates, and Lewis acids, e.g., aluminum, zinc, iron, and boron halides. Organochlorosilanes containing Si—H disproportionate in the presence of aluminum chloride without addition of more organosilane. A wide variety of organosilanes are most commonly prepared through reaction of inorganic and organochlorosilanes with Grignard reagents. Organosilanes containing mixed organic groups can be prepared by reaction of organodihalosilanes and diorganohalosilanes or alkoxy derivatives with alkyl or aryl Grignards. Organohydrosilanes can also be prepared by addition of halosilanes and organosilanes containing multiple Si—H bonds to olefins. These reactions are catalyzed by platinum, platinum salts, peroxides, ultraviolet light, or ionizing radiation.

Azidosilanes, the characteristics and preparation thereof, have been described; see, for example, Wiberg, Int. Symp. Organosilicon Chem., Sci. Commun., pp. 232-35, 1965; Liu, Sheng-Lieh, et al., J. Chin. Chem. Soc. (Taipei), V. 17, N. 4, pp. 229-34 (1970); Wiberg, Nils, et al., J. Organometal. Chem., V. 22, N. 2, pp. 349-56 (1970).

A large variety of "thin films" are used in the fabrication of Very Large Scale Integration (VLSI) devices. These films may be thermally grown or deposited from the vapor phase. They can be metals, semiconductors, or insulators.

Thin films for use in VLSI fabrication must satisfy a large set of rigorous chemical, structural, and electrical requirements. Film composition and thickness must be strictly controlled to facilitate etching of submicron features. Very low densities of both particulate defects and film imperfections, such as pinholes, become critical for the small linewidths, high densities, and large areas necessary for VLSI. These small geometries also create highly rugged topography for overlying films to cover. Therefore, excellent adhesion, low stress, and conformal step coverage are required of a VLSI thin film, and its own surface topography should reduce or even planarize the underlying steps if possible. Finally, non-conducting thin films must have low dielectric constants to reduce parasitic capacitances exacerbated by the scaled down film thicknesses.

Although the properties of a bulk material may be well characterized, the same material in its thin film form may have properties substantially different from those of the bulk. One reason is that thin film properties are strongly influenced by surface properties, while in bulk materials this is not the case. The thin film, by its very definition has a substantially higher surface-to-volume ratio than does a bulk material. The structure of thin films, and their method of preparation also play a vital role in determining the film properties.

The formation of such films is accomplished by a large variety of techniques, but which can conceptually be divided into two groups: (1) film growth by interaction of a vapor-deposited species with the substrate; and (2) film formation by deposition without causing changes to the substrate material. The first category includes thermal oxidation and nitridation of single crystal silicon and polysilicon and the formation of silicides by direct reaction of a deposited metal and the substrate.

The second group includes another three subclasses of deposition: (a) chemical vapor deposition, or CVD, in which solid films are formed on a substrate by the chemical reaction of vapor phase chemicals that contain the required constituents; (b) physical vapor deposition, or PVD, in which the species of the thin film are physically dislodged from a source to form a vapor which is transported across a reduced pressure region to the substrate, where it condenses to form the thin film; and (c) coating of the substrate with a liquid, which is then dried to form the solid thin film. When CVD process are used to form single-crystal thin films, the process is termed epitaxy. The formation of thin films by PVD includes the processes of sputtering and evaporation.

Thin films, generally, have smaller grain size than do bulk materials. Grain size is a function of the deposition conditions and annealing temperatures. Larger grains are observed for increased film thickness, with the effect increasing with increasing substrate or deposition temperature. The initial deposition temperature plays an important role in determining the final grain size. The dependence on deposition rate is due to the fact that even if clusters have high mobility, at high deposition rate they are quickly buried under subsequent layers. For very high deposition rates, the heat of condensation can raise the substrate temperature, thereby producing increased grain size from thermal effects.

The surface roughness of films occurs as a result of the randomness of the deposition process. Real films almost always show surface roughness, even though this represents a higher energy state than that of a perfectly flat film. Depositions at high temperatures tend to show less surface roughness. This is because increased surface mobility from the higher substrate temperatures can lead to filling of the peaks and valleys. On the other hand, higher temperatures can also lead to the development of crystal facets, which may continue to grow in favored directions, leading to increased surface roughness. At low temperatures the surface roughness as measured by surface area, tends to increase with increased film thickness. Oblique deposition which results in shadowing, also increases surface roughness. Epitaxial and amorphous deposits have shown measured surface area nearly equal to the geometrical area, implying the existence of very flat films. This has been confirmed by Scanning Electron Micrography (SEM) examination of these films. Surface roughness has also been observed to increase as a result of the presence of contamination on the substrate or in the vapor phase during deposition.

The density of a thin film provides information about its physical structure. Density is usually determined by weighing the film and measuring its volume. If a film is porous from the deposition process, it generally has a lower density than bulk material.

The crystallographic structure of thin films depends on the adatom mobility and can vary from a highly disordered or amorphous-like state to a well-ordered state, e.g. epitaxial growth on a single crystal substrate. The amorphous structures are frequently observed for the deposited dielectrics such as $SiO_2$, $SiO$, and $Si_3N_4$, while most metals result in polycrystalline structure. Silicon can be either amorphous, polycrystalline, or single crystal, depending on the deposition parameters and the substrate material.

Some polycrystalline films deposit with a fiber texture or preferred orientation. This texture can be described as having a preponderance of grains with the same orientation in a direction normal to the substrate. Deposition of polycrystalline Si on $SiO_2$ can occur in this manner. The observed fiber texture in that case has been reported as for poly-Si deposited at 600°-650° C.

The single crystal substrate is the dominant factor in epitaxy. Some crystal symmetry must exist between the deposit and the substrate, and the lattice parameters of each material must be close to the same value. The lattice misfit, which is the percentage difference between the lattice constant of the deposit and that of the substrate plane in contact, must be small to achieve epitaxy. The deposition temperature also plays a role in epitaxy. Elevated temperatures increase the propensity for epitaxial growth. This is engendered by several mechanisms, including: cleaner surfaces; decreased supersaturation; and increased adatom energy.

The deposition rate also plays a role in epitaxy. Lower rates tend toward epitaxy, while higher deposition rates lead to polycrystalline or amorphous deposition. Three growth regimes are observed for the deposition of Si on a clean Si substrate: (a) at low temperature and high deposition rates the deposits are amorphous; (b) at high substrate temperatures and low rate deposition they tend to be single crystal; and (c) at intermediate conditions polycrystalline films tend to form.

Nearly all films are found to be in a state of internal stress, regardless of the means by which they have been produced. The stress may be compressive or tensile. Compressively stressed films would like to expand parallel to the substrate surface, and in the extreme, films in compressive stress will buckle up on the substrate. Films in tensile stress, on the other hand, would like to contract parallel to the substrate, and may crack if their elastic limits are exceeded. In general, the stresses in thin films are in the range of $10^8$–$5 \times 10^{10}$ dynes/cm$^2$. Highly stressed films are generally undesirable for VLSI applications for several reasons, including: (a) they are more likely to exhibit poor adhesion; (b) they are more susceptible to corrosion; (c) brittle films, such as inorganic dielectrics, may undergo cracking in tensile stress; and (d) the resistivity of stressed metallic films is higher than that of their annealed counterparts.

The intrinsic stress reflects the film structure in ways not yet completely understood. It has been observed that the intrinsic stress in a film depends on thickness, deposition rate, deposition temperature, ambient pressure, method of film preparation, and type of substrate used, among other parameters.

At low substrate temperatures, metal films tend to exhibit tensile stress. This decreases with increasing substrate temperature, often in a linear manner, finally going through zero or even becoming compressive. The changeover to compressive stress occurs at lower temperatures for lower melting point metals.

The effect of deposition rate on film stress is ambiguous. The film stress starts out tensile, decreases as the power increases, and finally becomes compressive with further power increase.

In practice, the chemical reactions of the reactant gases leading to the formation of a solid material may take place not only on or very close to the wafer surface, a heterogeneous reaction, but also in the gas phase, a homogeneous is usually mass-transport limited, while at lower temperatures it is surface-reaction rate-limited. In actual processes the temperature at which the deposition condition moves from one of these growth regimes to the other is dependent on the activation energy of the reaction, and the gas flow conditions in the reactor. Thus, it is impossible to extrapolate with any certainty or accuracy date or process conditions or results from one pressure regime or temperature regime to another.

In processes that are run under reaction rate-limited conditions, the temperature of the process is an important parameter. That is, uniform deposition rates throughout a reactor require conditions that maintain a constant reaction rate. This in turn implies that a constant temperature must also exist everywhere at all wafer surfaces. On the other hand, under such conditions the rate at which reactant species arrive at the surface is not as important, since their concentration does not limit the growth rate. Thus, it is not as critical that a reactor be designed to supply an equal flux of reactants to all locations of a wafer surface. It will be seen that in low-pressure CVD (LPCVD) reactors, wafers can be stacked vertically and at very close spacing because such systems operate in a reaction rate limited mode. The reason for this is as follows:

Under the low pressure of an LPCVD reactor ~1 torr the diffusivity of the gas species is increased by a factor of 1000 over that at atmospheric pressure, and this is only partially offset by the fact that the boundary layer, the distance across which the reactants must diffuse, increases by less than the square root of the pressure. The net effect is that there is more than an order of magnitude increase in the transport of reactants to and by-products away from the substrate surface, and the rate-limiting step is thus the surface reaction.

In deposition processes that are mass-transport limited, however, the temperature control is not nearly as critical. As mentioned earlier, the mass transport process which limits the growth rate is only weakly dependent on temperature. On the other hand, it is very important that the same concentration of reactants be present in the bulk gas regions adjacent to all locations of a wafer, as the arrival rate is directly proportional to the concentration in the bulk gas. Thus, to insure films of uniform thickness across a wafer, reactors which are operated in the mass transport limited regime must be designed so that all locations of wafer surfaces and all wafers in a run are supplied with an equal flux of reactant species. Atmospheric pressure reactors that deposit $SiO_2$ at ~400° C. operate in the mass-transport limited regime. The most widely used APCVD reactor designs provide a uniform supply of reactants by horizontally positioning the wafers and moving them under a gas stream.

CVD systems usually contain the following components: (a) gas sources; (b) gas feed lines; (c) mass-flow controllers for metering the gases into the system; (d) a reaction chamber or reactor; (e) a method for heating the wafers onto which the film is to be deposited, and in some types of systems, for adding additional energy by other means; and (f) temperature sensors. LPCVD and PECVD systems also contain pumps for establishing the reduced pressure and exhausting the gases from the chamber.

The design and operation of CVD reactors depends on a variety of factors, and hence they can be categorized in several ways. The first distinction between reactor types is whether they are hot-wall or cold-wall reactors, and this is dependent on the method used to heat the wafers. The next criterion used to distinguish reactor types is their pressure regime of operation atmospheric pressure or reduced pressure reactors. Finally, the reduced pressure group is split into: (a) low-pressure reactors the so called low-pressure CVD, or LPCVD reactors, in which the energy input is entirely thermal; and (b) those in which energy is partially supplied by a plasma as well known as plasma-enhanced CVD, or PECVD reactors. Each of the reactor types in the two pressure regimes are further divided into sub-groups, defined by reactor configuration and method of heating. Table 1 summarizes the characteristics and applications of the various CVD reactor designs.

TABLE 1

Characteristics and Applications of CVD Reactors

| Process | Advantages | Disadvantages | Applications |
|---|---|---|---|
| APCVD Low Temperature | Simple Reactor, Fast Deposition, Low Temperature | Poor Step Coverage, Particle Contamination | Low Temperature Oxides, both doped and undoped |
| LPCVD | Excellent Purity and Uniformity, Conformal Step Coverage, Large Wafer Capacity | High Temperature, Low Deposition Rate | High Temperature Oxides, both doped and undoped, Silicon |

TABLE 1-continued

Characteristics and Applications of CVD Reactors

| Process | Advantages | Disadvantages | Applications |
| --- | --- | --- | --- |
| PECVD | Low Temperature, Fast Deposition, Good Step Coverage | Chemical. e.g. $H_2$ and Particulate | Nitride, Poly-Si, W, $WSi_2$ Low Temperature Insulators over Metals, (Nitride) |

Low pressure chemical vapor deposition (LPCVD) in some cases is able to overcome the uniformity, step coverage, and particulate contamination limitations of early APCVD systems. By operating at medium vacuum, 30–250 Pa or 0.25–2.0 torr, and higher temperatures, 550°–600° C., LPCVD reactors typically deposit films in the reaction rate limited regime. At reduced pressure the diffusivity of the reactant gas molecules is sufficiently increased so that mass-transfer to the substrate no longer limits the growth rate. The surface reaction rate is very sensitive to temperature, but precise temperature control is relatively easy to achieve. The elimination of mass-transfer constraints on reactor design allows the reactor to be optimized for high wafer capacity. Low pressure operation also decreases gas phase reactions, making LPCVD films less subject to particulate contamination. LPCVD is used for depositing many types of films, including poly-Si, $Si_3N_4$, $SiO_2$, PSG, BPSG, and W.

The two main disadvantages of LPCVD are the relatively low deposition rates, and the relatively high operating temperatures. Attempting to increase deposition rates by increasing the reactant partial pressures, tends to initiate gas phase reactions. Attempting to operate at lower temperatures, results in unacceptably slow film deposition. One of the features of the present invention is the discovery that by using selected deposition source reagents, rather than methyl-containing reagents and the like which have been traditional, greatly increased deposition rates can be accomplished without the deleterious reactions and poor results which have plagued the industry for so many years.

LPCVD reactors are designed in two primary configurations: (a) horizontal tube reactors; and (b) vertical flow isothermal reactors.

Horizontal tube, hot wall reactors are the most widely used LPCVD reactors in VLSI processing. They are employed for depositing poly-Si, silicon nitride, and undoped and doped $SiO_2$ films. They find such broad applicability primarily because of their superior economy, throughput, uniformity, and ability to accommodate large diameter, e.g. 150 mm wafers. Their main disadvantages are susceptibility to particulate contamination and low deposition rates.

The vertical flow isothermal LPCVD reactor further extends the distributed gas feed technique, so that each wafer receives an identical supply of fresh reactants. Wafers are again stacked side by side, but are placed in perforated-quartz cages. The cages are positioned beneath long, perforated, quartz reaction-gas injector tubes, one tube for each reactant gas. Gas flows vertically from the injector tubes, through the cage perforations, past the wafers, parallel to the wafer surface and into exhaust slots below the cage. The size, number, and location of cage perforations are used to control the flow of reactant gases to the wafer surfaces. By properly optimizing cage perforation design, each wafer can be supplied with identical quantities of fresh reactants from the vertically adjacent injector tubes. Thus, this design can avoid the wafer-to-wafer reactant depletion effects of the end-feed tube reactors, requires no temperature ramping, produces highly uniform depositions, and reportedly achieves low particulate contamination.

The third and last of the major CVD deposition methods is categorized not only by pressure regime, but also by its method of energy input. Rather than relying solely on thermal energy to initiate and sustain chemical reactions, plasma enhanced CVD, or PECVD uses an rf-induced glow discharge to transfer energy into the reactant gases, allowing the substrate to remain at a lower temperature than in APCVD or LPCVD processes. Lower substrate temperature is the major advantage of PECVD, and in fact, PECVD provides a method of depositing films on substrates that do not have the thermal stability to accept coating by other methods, the most important being the formation of silicon nitride and $SiO_2$ over metals. In addition, PECVD can enhance the deposition rate when compared to thermal reactions alone, and produce films of unique compositions and properties. Desirable properties such as good adhesion, low pinhole density, good step coverage, adequate electrical properties, and compatibility with fine-line pattern transfer processes, have led to application of these films in VLSI.

The plasma, also referred to as a glow discharge, which is defined as a partially ionized gas containing an equal number of positive and negative charges as well as some other number of non-ionized gas particles, is generated by the application of a radio frequency field to a low pressure gas, thereby creating free electrons within the discharge region. The electrons gain sufficient energy from the electric field so that when they collide with gas molecules, gas-phase dissociation and ionization of the reactant gases, e.g. silane and nitrogen or oxygen-containing species then occurs.

The energetic particles used to strike target materials to be sputtered in VLSI sputter deposition systems are generated by glow-discharges. A glow-discharge is a self-sustaining type of plasma.

The energetic species are then adsorbed on the film surface. The radicals tend to have high sticking coefficients, and also appear to migrate easily along the surface after adsorption. These two factors can lead to excellent film conformality. Upon being adsorbed on the substrate, they are subjected to ion and electron bombardment, rearrangements, reactions with other adsorbed species, new bond formations and film formation and growth. Adatom rearrangement includes the diffusion of the adsorbed atoms onto stable sites and concurrent desorption of reaction products. Desorption rates are dependent on substrate temperature, and higher temperatures produce films with fewer entrapped by-products. Gas-phase nucleation should be avoided to reduce particulate contamination.

The fact that the radicals formed in the plasma discharge are highly reactive presents some options, as well as some problems, to the process engineer. PECVD films, in general, are not stoichiometric because the deposition reactions are so varied and complicated. Moreover, by-products and incidental species are incorporated into the resultant films, especially hydrogen, nitrogen, and oxygen, in addition to the desired products. Excessive incorporation of these contaminants may lead to outgassing and concomitant bubbling, cracking, or peeling during later thermal cycling, and to threshold shifts in MOS circuits.

A plasma process requires control and optimization of several deposition parameters besides those of an LPCVD process, including rf power density, frequency, and duty cycle. The deposition process is dependent in a very complex and interdependent way on these parameters, as well as on the usual parameters of gas composition, flow rates, temperature, and pressure. Furthermore, as with LPCVD, the PECVD method is surface reaction limited, and adequate substrate temperature control is thus necessary to ensure film thickness uniformity.

Three types of PECVD reactors are available: (1) the parallel plate type; (2) the horizontal tube type; and (3) the single wafer type. It should be noted that with one major exception, the discussion on glow discharges, rf diode sputtering, and rf generated plasmas for dry etching applies to the production of rf generated plasma in PECVD reactors.

Chemical vapor deposited (CVD) $SiO_2$ films, and their binary and ternary silicates, find wide use in VLSI processing. These materials are used as insulation between polysilicon and metal layers, between metal layers in multilevel metal systems, as getters, as diffusion sources, as diffusion and implantation masks, as capping layers to prevent outdiffusion, and as final passivation layers. In general, the deposited oxide films must exhibit uniform thickness and composition, low particulate and chemical contamination, good adhesion to the substrate, low stress to prevent cracking, good integrity for high dielectric breakdown, conformal step coverage for multilayer systems, low pinhole density, and high throughput for manufacturing.

CVD silicon dioxide is an amorphous structure of $SiO_4$ tetrahedra with an empirical formula $SiO_2$. Depending on the deposition conditions, as summarized in Table 2, CVD silicon dioxide may have lower density and slightly different stoichiometry from thermal silicon dioxide, causing changes in mechanical and electrical film properties, such as index of refraction, etch rate, stress, dielectric constant and high electric-field breakdown strength. Deposition at high temperatures, or use of a separate high temperature post-deposition anneal step, referred to as densification can make the properties of CVD films approach those of thermal oxide.

$SiO_2$ is deposited with or without dopants, and each type has unique properties and applications.

There are various reactions that can be used to prepare CVD $SiO_2$. The choice of reaction is dependent on the temperature requirements of the system, as well as the equipment available for the process. The deposition variables that are important for CVD $SiO_2$ include: temperature, pressure, reactant concentrations and their ratios, presence of dopant gases, system configuration, total gas flow, and wafer spacing. There are three temperature ranges in which $SiO_2$ is formed by CVD, each with its own chemical reactions and reactor configurations. There are: 1) low temperature deposition, 300°–450° C.; 2) medium temperature deposition, 650°–750° C.; and 3) high temperature deposition, ~900° C.

The low temperature deposition of $SiO_2$ utilizes a reaction of silane and oxygen to form undoped $SiO_2$ films. The depositions are carried out in APCVD reactors, primarily of the continuous belt type, in distributed feed LPCVD reactors, or in PECVD reactors. The depletion effect precludes the use of conventional LPCVD for the $SiH_4+O_2$ reaction. The addition of $PH_3$ to the gas flow forms $P_2O_5$, which is incorporated into the $SiO_2$ film to produce a phosphosilicate glass (PSG). The reactions are given by:

$$SiH_4 + O_2 \rightarrow SiO_2 + 2H_2$$

$$4PH_3 + 5O_2 \rightarrow 2P_2O_5 + 6H_2$$

The reaction between silane and excess oxygen forms $SiO_2$ by heterogeneous surface reaction. Homogeneous gas-phase nucleation also occurs, leading to small $SiO_2$ particles that form a white powder on the reaction chamber walls, and which may potentially cause particulate contamination in the deposited films.

The deposition rate increases slowly with increased temperature between 310° and 450° C. An apparent activation energy of less than 0.4 eV has been measured which is indicative of a surface adsorption or gas phase diffusion deposition process. The deposition rate can be increased at constant temperature, up to a limit by increasing the $O_2:SiH_4$ ratio. Continued increase in the ratio eventually results in a decrease in deposition rate, as a result of $O_2$ being adsorbed on the substrate, thus inhibiting the $SiH_4$ decomposition.

TABLE 2

| | Properties of CVD and Thermal Silicon Dioxide Films | | | | |
|---|---|---|---|---|---|
| | Film Type | | | | |
| Property | Thermal | PECVD | APCVD | $SiCl_2H_2 + N_2O$ | TEOS |
| Deposition Temp. (°C.) | 800–1200 | 200 | 450 | 900 | 700 |
| Step Coverage | Conformal | Good | Poor | Conformal | Conformal |
| Stress ($\times 10^9$ dynes/cm$^2$) | 3C | 3C–3T | 3T | 3T | 1C–2T |
| Dielectric Strength ($10^6$ V/cm) | 6–10 | 8 | 10 | 10 | 3–6 |
| Etch Rate (Å/min): (100:1, $H_2O$:HF) | | 400 | 60 | 30 | 30 |

Deviation of the CVD silicon dioxide film's refractive index, n, from that of the thermal $SiO_2$ value of 1.46 is often used as an indicator of film quality. A value of n greater than 1.46 indicates a silicon rich film, while smaller values indicate a low density, porous film. CVD Silicon dioxide films deposited at low temperatures exhibit lower densities than thermal $SiO_2$, and have an index of refraction of ~1.44. They also exhibit substantially higher etch rates in buffered hydrofluoric acid, HF solutions that thermal $SiO_2$. Subsequent heating of such films to temperatures between 700°–1,000° C. causes densification. That is, this step causes the density of the material to increase from 2.1 g/cm$^3$ to 2.2 g/cm$^3$, the film thickness to decrease, and the etch rate in HF to decrease.

$SiO_2$ can also be deposited by a plasma enhanced reaction between $SiH_4$ and $N_2O$, nitrous oxide or $O_2$ at temperatures between 200°–400° C.

$$SiH_4 + 2N_2O \xrightarrow{200-400°C, rf} SiO_2 + 2N_2 + 2H_2$$

Nitrogen and/or hydrogen is often incorporated in PECVD $SiO_2$. A low ratio of $N_2O/SiH_4$ will increase the index of refraction, due to large amounts of nitrogen incorporated in the film and the formation of silicon rich films. Nearly stoichiometric, $n = 1.46$, plasma oxide films can be achieved by reacting $SiH_4$ and $O_2$ mixtures. The buffered HF etch rate is a sensitive measure of the film's stoichiometry and density. Lower deposition temperatures and higher $N_2O/SiH_4$ ratios lead to less dense films and faster etch rates. As with nitride films, PECVD oxides also contain 2–10 at % $H_2$ in the form of Si—H, Si—O—H, and H—O—H. The hydrogen concentration is a strong function of the deposition parameters. Low deposition temperatures, high rf power, and high carrier-gas flow rates are required to prevent gas phase nucleation and its attendant particulate problems.

Plasma oxide films are generally deposited in compressive stress, with values ranging between $1 \times 10^8 – 4 \times 10^9$ dynes/cm$^2$, depending on deposition temperature and rate. Dielectric strengths of $4-8 \times 10^6$ V/cm, and dielectric constants ranging from 4–5 have been obtained. Low pinhole counts have been obtained with PECVD oxides, as have very conformal coatings. Adhesion to metal is also reported to be excellent.

In the medium temperature range, $SiO_2$ is deposited in LPCVD reactors by decomposing tetraethosiloxane, $Si(OC_2H_5)_4$, also known as tetraethyl orthosilicate, or TEOS. The deposition rate for TEOS shows an exponential increase with temperature in the range of 650°–800° C. with an apparent activation energy of 1.9 eV. This pronounced temperature dependence can lead to thickness control problems. The deposition rate is also dependent on the TEOS partial pressure. It is linearly dependent at low partial pressures, and tends to level off as the adsorbed TEOS saturates the surface. TEOS films generally show excellent conformality.

At high temperatures, near 900° C., $SiO_2$ is formed by an LPCVD process in which dichlorosilane and nitrous oxide are reacted. The reaction is given by:

$$SiH_2CL_2 + 2N_2O \rightarrow SiO_2 + 2N_2 + 2HCl.$$

Such depositions produce films having excellent uniformity, and with properties close to those of thermal $SiO_2$. High-temperature LPCVD is sometimes used to deposit $SiO_2$ over poly-Si.

Materials can be prepared with characteristics between those of nitrides and oxides, and these are called silicon oxynitrides [$SiO_xN_y(H_z)$]. They are formed by reacting $SiH_4$ with $N_2O$ and $NH_3$. Properties can be tailored for improved thermal stability, low stress, and crack resistance. Such films are also less permeable to moisture and other contaminants than deposited oxides. The use of helium as a carrier gas is reported to increase the uniformity of the refractive index of the films. Silicon oxynitrides also are reported to exhibit good properties for use as low-temperature deposited insulators between Al conductors. Two-layer films of PECVD silicon oxynitride and silicon nitride have been used in multilevel interconnect planarization schemes utilizing the differential etch rates of the two materials.

Many treatises, texts and a massive volume of technical journal literature describe in more detail the background of the technology in which this invention lies; see, for example, Thomas, HANDBOOK OF TRANSISTORS, SEMICONDUCTORS, INSTRUMENTS AND MICROELECTRONICS, Prentice Hall, Englewood Cliffs, N.J. 1968 and the extensive publications of the J. C. Schumacher Company, e.g. *Tetraethyl Orthosilicate (TEOS)*, Product Data Sheet No. 6; *Tetraethyl Orthosilicate for Semiconductor High Temperature Silicon Dioxide Depositions*, Product Application Note No. 8; *TEOS and Liquid Dopant Sources for CVD SiO$_2$, PSG, and BPSG*, Product Application Note No. 15; Adams and Capio, *The Deposition of Silicon Dioxide Films at Reduced Pressure*, Technical Article Reprint No. 5.

Thus, the deposition of doped and undoped silicon oxide films is an important process in semiconductor device fabrication. The decomposition process commonly utilizes toxic and pyrophoric gases. The use of safer liquid sources is the goal of many investigators. F. S. Becker and D. Pawlik, ECS 85-2(85)380, ECS 86-8 p148 "A New LPCVD Borophosphosilicate Glass Process Based on the Doped Deposition of TEOS-Oxide". G. Smolinsky and T. P. H. F. Wendling, JECS 132(85)950 "Measurement of the Temperature Dependent stress of Silicon Oxide Films Prepared by a Variety of CVD Methods". G. Smolinsky and R. E. Dean "LPCVD of Silicon Oxide Films in the Temperature Range of 410° to 600° C. from Diacetoxyditertiarybutoxysilane". F. S. Becker, D. Pawlik, H. Schaefer, and G. Staudigl, JVST B4(86)232 "Process and Film Characterization of Low Pressure TEOS-Borophosphosilicate Glass". D. S. Williams and E. A. Dein "LPCVD of Borophosphosilicate Glass from Organic Reactants". The thermal decomposition of tetraethoxysilane (TEOS) has been used for over twenty years to obtain undoped silicon dioxide films in the temperature range from 600° to 800° C., A. Hochberg and D. O'-Meara "LPCVD of Silicon Dioxide Films from Tetraethoxysilane".

The deposition of silicon dioxide films has been disclosed in copending U.S. patent application Ser. No. 07/036,979, filed Apr. 10, 1987, to which reference is made for further background as to the state of the art, and U.S. Pat. No. 4,168,330 to Kaganowicz also discloses the use of some siloxanes in the deposition of silicon oxides by glow discharge at low temperatures.

An inherent characteristic of the glow discharge method, where the source is other than a single element, is the creation of a large number of ionized and non-ionized fragments of the source. Thus, plasma discharge operations differ very significantly from the thermal process. For example, it is well known that the thermal TEOS deposition takes place at temperatures in excess 650° C., even in the absence of oxygen. A plasma TEOS film deposition, on the other hand, occurs at temperatures below 350° C. in the presence of oxygen but does not produce a pure silicon dioxide. The film also contains significant amounts of hydrogen and is also contaminated with organic polymer residues. These carbonaceous impurities are only eliminated in a plasma/o- zone process at temperatures around 400° C. minimum in the presence of excess oxygen.

Nelson, U.S. Pat. No. 4,158,717 reviews the state of the art of producing silicon nitride films and describes the production silicon nitride films as protective and anti-reflective coatings and for masking semiconductive devices by a plasma discharge in azidotrimethylsilane, $(CH_3)_3SiN_3$, pointing out that azidotrimethylsilane is easier to handle than silane.

Matsuda et al, U.S. Pat. No. 4,569,855, discloses the use of azidosilanes in a very low temperature (50°–150° C.) high energy light activated gas deposition process for forming silicon and doped silicon films. While reference is made to alkyl, aryl and alkoxy azidosilanes, there is no specific disclosure of the use of ethyl, propyl, or butyl azidosilanes, or to higher-carbon alkyl, aryl or alkoxy azidosilanes in the Matsuda et al patent. Since the greater part of the Matsuda et al process activation energy for decomposing the gas to form a film comes from very high energy light photons, e.g. U.V., X-ray or gamma photons, it would not be possible to predict from Matsuda et al what may result from the use of higher-carbon azidosilanes in a thermal-activation method at higher temperatures.

It has now been discovered that very high quality silicon dioxide, silicon nitride and silicon oxynitride films can be deposited at hitherto unattainable deposition rates in an LPCVD process at low temperatures using 2-carbon or greater alkyl-, aryl- and aralkylazidosilanes.

SUMMARY OF THE INVENTION

High quality silicon dioxide and silicon oxynitride films are deposited, according to this invention, at temperatures of from about 325° C. to about 700° C., preferably in the range of about 350° C. to under 600° C. in a Low Pressure Chemical Vapor Deposition (LPCVD) process using alkylazidosilanes selected from the group consisting of alkylazidosilane, arylazidosilane and aralkylazidosilane wherein the alkyl-, aryl- or aralkyl- moiety comprises from one to six carbons, the preferred azidosilanes being mono-, di- and tri-ethylazidosilanes. The preferred azidosilane feed stocks are ethyltriazidosilane, diethyldiazidosilane and triethylazidosilane. Some data indicate that films can be formed as low as about 325° C. but operation in this range, though considered to be equivalent to operation above 350° C., is inefficient and results are not always optimal.

One of the major principles of this invention is the discovery that by using deposition source reagents described herein, rather than methyl-containing reagents and the like which have been traditional, greatly increased deposition rates can be accomplished without the deleterious reactions and poor results which have plagued the industry for a decade or more.

Ethyltriazidosilane, which produces excellent $SiO_2$ and silicon oxynitride films, and can be produced economically in high purity, is a preferred compound.

It will be understood that $R_1$, $R_2$, $R_3$ and $R_4$ may be different 2–4 carbon containing alkyl groups, such as, for example, ethylpropylazidosilane, etc. Generally speaking, however, the synthesis of such compounds is more complex and it would be more expensive to obtain such compounds in high purity industrial quantities.

DESCRIPTION OF THE PREFERRED EMBODIMENT

In a preferred embodiment, the process of this invention is carried out using the well established LPCVD technology, modified by the process conditions mentioned above and discussed hereinafter. The purpose of the discussion and examples is to disclose the preferred embodiment in such terms as will enable the worker skilled in the art to practice the invention, and not as a limitation upon the scope of the invention.

The preferred process of the present invention is carried out under LPCVD process conditions, varied as described, with a silicon-containing feed consisting essentially of compounds having the general formula

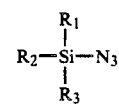

wherein: $R_1$, $R_2$, $R_3$ and $R_4$ are hydrogen, azido or C-2 to C-6 alkyl, aryl or aralkyl groups, at least one of $R_1$, $R_2$, $R_3$ and $R_4$, azido. Ethyltriazidosilane, diethyldiazidosilane, triethylazidosilane and tertiarybutyltriazidosilane, which in the presence of controlled amounts of oxygen from an oxygen source produces excellent $SiO_2$ and silicon oxynitride films, and can be produced economically in high purity, are preferred compounds.

The process of this invention is carried out in a vacuum in the general range of from about 0.1 torr to about 1.9 torr, and, most efficiently with best results, in a pressure range of from about 0.1 torr to 1 torr, and in a temperature range of from about 350° C. to 700° C., the optimum temperature range being a function of the silicon feed stock composition. Silicon oxynitride films are produced in an oxygen-containing vacuum atmosphere, using, typically, gaseous oxygen, nitrous oxide, carbon dioxide or mixtures thereof as the source. $SiO_2$ films are produced in an oxygen containing vacuum atmosphere. Such films can be obtained using carbon dioxide, but are more efficiently formed with better quality using oxygen gas as the oxygen source. Oxygen flow rates are not critical; however, it has been found that the $O_2$:Si feed stock ratio is optimally lower than in known processes. Oxygen flow is optimized based upon a particular Si-source feed rate empirically within the desired pressure range to maximize $SiO_2$ or, in the production of silicon oxynitride, to maximize silicon oxynitride film deposition rate and quality. As pointed out below, the oxygen source flow rate varies with temperature on a volume:volume ratio with the alkylsilane or alkylazidosilane from about a 1:1 volume ratio, or less in the production of oxynitride film, at low temperatures to 6:1 volume ratio, or higher, at temperatures near the high end of the operating range.

One of the advantages of the present invention is that layered films of different compositions can be deposited sequentially without major changes in process parameters or reagents. For example, a silicon oxynitride layer can be deposited over a silicon dioxide layer using an alkylazidosilane feed without shutting down the run, simply by reducing the oxygen flow rate or the temperature, or both, after depositing the silicon dioxide film under optimum $SiO_2$ deposition conditions. Conversely, a silicon dioxide layer can be deposited on a silicon oxynitride layer by increasing the temperature and/or increasing the oxygen input after depositing the oxynitride layer under optimum conditions using, typically, carbon dioxide as the oxygen source. A composite layer of, for example, silicon nitride, silicon oxynitride, silicon oxide, or the same layers in reversed direction, can be produced by beginning the run by, for example, depositing silicon nitride in an oxygen-free vacuum, then introducing oxygen, preferably as carbon dioxide, to produce the oxynitride layer, and then varying oxygen content and/or temperature to produce a silicon oxide layer.

A typical reaction is carried out in a 150 mm hot-wall LPCVD horizontal tube reactor, though the apparatus configuration is not critical, using, in the examples, 100 mm Si wafers, with an $R_1$, $R_2$, $R_3$ azidosilane feed rate of from about 0.05 to 2 gm/min, typically less than 0.5 gm/min, optionally with the flow of gaseous oxygen source, to optimize $SiO_2$ or $Si_xO_yN_z$ deposition rate and quality, and is adjusted on a vol:vol ratio with respect to the si-containing feed, and is a function of temperature.

The following example illustrates, but does not limit, the concept or scope of the invention.

EXAMPLE 1, ETHYLTRIAZIDOSILANE

The process as described was carried out using ethyltriazidosilane as the Si-containing feed stock, and oxygen source gas flowed into the reactor under the conditions set forth in the following table

| Run | Source Temp °F. | Source Flow Rate[1] | Oxygen Flow Rate[1] | Deposition Rate[2] | Refractive Index of Coating | Reactor Pressure[3] |
|---|---|---|---|---|---|---|
| 1 | 500 | 17 | 100 | 36 | 1.57 | 420 |
| 2 | 500 | 31 | 50 | 35 | 1.62 | 420 |
| 3 | 515 | 17 | 100 | 60 | 1.54 | 420 |
| 4 | 600 | 17 | 100 | 140 | 1.47 | 420 |
| 5 | 350 | 50 | 50 | 10 | 1.46 | 400 |

[1] Standard cubic centimeters per minute (sccm)
[2] Angstroms per minute (Å/min)
[3] Millitorr (mtorr)

The oxynitride composition of the film produced in the foregoing example was measured by ellipsometry and energy dispersive x-ray (EDX). The ellipsometry data was used in the equation of Gain et al. J. Electrochem. Soc. 124(177)599.

$n_{oxynitride} = x \cdot n_{SiO_2} + y \cdot n_{Si_3N_4}$ with $x = 1 - y$,
$n_{SiO_2} = 1.46$, $n_{Si_3N_4} = 2.05$.

The oxygen-to-nitrogen concentrations in the films, as obtained by the ellipsometry method, compared favorably with the ratio of oxygen to nitrogen determined by EDX.

The composition by EDX was determined by the ratio of oxygen to nitrogen peak counts. The EDX analysis was calibrated with measurements on identical films using Auger Electron Spectroscopy. The films were also analyzed by infrared spectroscopy showing the Si—O and Si—N bonds. Although this latter method is not quantitative, it may be used to obtain relative ratios of bonded oxygen to bonded nitrogen in films of approximately the same thicknesses.

It is generally accepted that a film with a refractive index of 1.46 is substantially $SiO_2$. Thus, in the foregoing example, runs 1 through 4 produced silicon oxynitride film while run 5 produced a silicon dioxide film.

One of the advantages of the present invention is that the silicon source is a liquid with a vapor pressure easily controlled to that required for delivery by commercially available mass flow controllers. It does not present the handling and delivery problems of silane and dichlorosilane now used to produce similar film depositions.

In addition, virtually any of a continuum of $SiO_2$ to silicon oxynitride films can be obtained with easily made variations in the process parameters. The compounds of this invention have higher vapor pressures than the alkoxysilanes and flow rates are more easily controlled using known mass flow controllers and control methods than the alkoxysilanes and yet avoid the hazards of the silanes.

As pointed out before, the deposition rates attainable are surprisingly high, 50 to 60 times as high in some cases, as compared with alkoxysilanes, and it is possible to prepare excellent films even at low temperatures and high deposition rates. It has been discovered that the degradation of surface characteristics of aluminum surface substrates which is experienced at higher temperatures is avoided using the present invention.

Where desirable, it is, of course, possible to add a dopant to the film, simply by adding the dopant vapor in the LPCVD chamber during deposition.

INDUSTRIAL APPLICATION

The greatest industrial application of this invention is in the manufacture of semiconductor devices; however, the discoveries of this invention are applicable to any thin film deposition of $SiO_2$ and $Si_xO_yN_z$ on substrates which are capable of being heated to temperatures in the range of from about 350° C. to about 700° C.

What is claimed is:

1. A low temperature chemical vapor deposition process comprising the steps of:
    heating in a chemical vapor deposition reactor a substrate upon which deposition is desired to a temperature of from about 350° C. to about 700° C. at a pressure of from about 0.1 torr to about atmospheric pressure, and maintaining such pressure during the process;
    introducing into the reactor a silicon-containing feed and a source of gaseous oxygen, said silicon containing feed consisting essentially of one or more compounds having the general formula

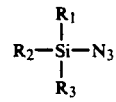

wherein: $R_1$, $R_2$, and $R_3$ are hydrogen, azido or 1–6 carbon alkyl, phenyl or 7 to 10 carbon alkaryl groups, at least one of $R_1$ and $R_2$ being 1–6 carbon alkyl, phenyl or 7 to 10 carbon alkaryl
    maintaining the flow of said source of gaseous oxygen and the temperature and pressure in said ranges to cause a film of silicon dioxide or silicon oxynitride to deposit on said substrate.

2. The process of claim 1 wherein the silicon containing feed is an azidosilane selected from the group consisting of alkylazidosilane, arylazidosilane and aralkylazidosilane wherein the alkyl-, aryl- or aralkyl- moiety comprises from 1 to 10 carbons.

3. The process of claim 1 wherein the silicon containing feed consists essentially of ethyltriazidosilane.

4. The process of claim 1 wherein the silicon containing feed is diethyldiazidosilane.

5. The process of claim 1 wherein the silicon containing feed consists essentially of butyltriazidosilane.

6. The process of claim 1 wherein for a given temperature and pressure the volumetric flow ratio of silicon containing feed to said gaseous oxygen is maintained at a level to cause formation of a silicon dioxide film.

7. The process of claim 1 wherein for a given temperature and pressure the volumetric flow ratio of silicon containing feed to said gaseous oxygen is maintained at a level to cause formation of a silicon oxynitride film.

8. The process of claim 7 wherein the silicon containing feed is selected from the group consisting of diethyldiazidosilane, ethyltriazidosilane and butyltriazidosilane.

9. The process of claim 1 further comprising the steps of:
introducing sufficient oxygen at the beginning of the process period at a first temperature to cause the formation of a silicon dioxide film on the substrate; and
thereafter changing the temperature or reducing the rate of oxygen introduction, or both, to cause the formation of a silicon oxynitride film on the previously formed silicon dioxide film.

10. A chemical vapor deposition process comprising the steps of:
heating a substrate upon which deposition is desired to a temperature of from about 350° C. to about 700° C. in a vacuum having a pressure of about 1±0.9 torr, and maintaining such pressure during the process;
introducing an azidosilane selected from the group consisting of alkylazidosilane, arylazidosilane and aralkylazidosilane wherein the alkyl, aryl- or aralkyl- moiety comprises from 1-6 carbon alkyl, phenyl or 7-10 carbon alkaryl, and an oxygen source into the vacuum; and
maintaining the temperature and pressure in said ranges to cause a film of silicon oxynitride to deposit on said substrate.

11. The process of claim 10 wherein the azidosilane is ethyltriazidosilane and the temperature is from about 350° C. to about 600° C.

12. The process of claim 10 wherein the azidosilane is diethyldiazidosilane and the temperature is from about 500° C. to about 600° C.

13. The process of claim 10 wherein the azidosilane is butyltriazidosilane and the temperature is from about 350° C. to about 600° C.

14. A chemical vapor deposition process comprising the steps of:
heating a substrate upon which deposition is desired to a temperature of from about 350° C. to about 700° C. in a vacuum having a pressure of about 1±0.9 torr, and maintaining such pressure during the process;
introducing an azidosilane selected from the group consisting of alkylazidosilane, arylazidosilane and aralkylazidosilane wherein the alkyl, aryl- or aralkyl- moiety comprises from 1-6 carbon alkyl, phenyl or 7-10 carbon alkaryl, and an oxygen source into the vacuum; and
maintaining the temperature and pressure in said ranges to cause a film of silicon dioxide to deposit on said substrate.

15. The process of claim 14 wherein the azidosilane is ethyltriazidosilane and the temperature is from about 350° C. to about 600° C.

16. The process of claim 14 wherein the azidosilane is diethyldiazidosilane and the temperature is from about 500° C. to about 600° C.

17. The process of claim 14 wherein the azidosilane is butyltriazidosilane and the temperature is from about 350° C. to about 600° C.

18. A chemical vapor deposition process comprising the steps of:
heating in a chemical vapor deposition reactor a substrate upon which deposition is desired to a temperature of from about 350° C. to about 700° C. at a pressure of about 0.1 torr to about 1.9 torr, and maintaining such pressure during the process;
introducing into said reactor an azidosilane selected from the group consisting of alkylazidosilane, arylazidosilane and aralkylazidosilane wherein the alkyl, aryl- or aralkyl- moiety comprises from 1-6 carbon alkyl, phenyl or 7-10 carbon alkaryl, and an oxygen source; and
maintaining the temperature and pressure in said ranges to cause a film of silicon dioxide to deposit on said substrate.

19. The process of claim 18 wherein the azidosilane is ethyltriazidosilane and the temperature is from about 350° C. to about 600° C.

20. The process of claim 18 wherein the azidosilane is diethyldiazidosilane and the temperature is from about 500° C. to about 600° C.

21. The process of claim 18 wherein the azidosilane is butyltriazidosilane and the temperature is from about 350° C. to about 600° C.

22. A chemical vapor deposition process comprising the steps of:
heating in a chemical vapor deposition reactor a substrate upon which deposition is desired to a temperature of from about 350° C. to about 700° C. at a pressure of about 0.1 torr to about 1.9 torr, and maintaining such pressure during the process;
introducing into said reactor an azidosilane selected from the group consisting of alkylazidosilane, arylazidosilane and aralkylazidosilane wherein the alkyl,aryl- or aralkyl- moiety comprises from 1-6 carbon alkyl, phenyl or 7-10 carbon alkaryl, and an oxygen source; and
maintaining the temperature and pressure in said ranges to cause a film of silicon oxynitride to deposit on said substrate.

23. The process of claim 22 wherein the azidosilane is ethyltriazidosilane and the temperature is from about 350° C. to about 600° C.

24. The process of claim 22 wherein the azidosilane is diethyldiazidosilane and the temperature is from about 500° C. to about 600° C.

25. The process of claim 22 wherein the azidosilane is butyltriazidosilane and the temperature is from about 350° C. to about 600° C.

* * * * *